(12) United States Patent
Tamura et al.

(10) Patent No.: US 11,282,723 B2
(45) Date of Patent: Mar. 22, 2022

(54) LIQUID DELIVERY MEMBER, LIQUID DELIVERY APPARATUS, AND SEMICONDUCTOR DEVICE MANUFACTURING METHOD

(71) Applicant: KIOXIA CORPORATION, Minato-ku (JP)

(72) Inventors: Hironobu Tamura, Yokkaichi (JP); Ikuo Yoneda, Yokkaichi (JP); Yoshiharu Ono, Yokkaichi (JP)

(73) Assignee: KIOXIA CORPORATION, Minato-ku (JP)

( * ) Notice: Subject to any disclaimer, the term of this patent is extended or adjusted under 35 U.S.C. 154(b) by 0 days.

(21) Appl. No.: 16/559,924

(22) Filed: Sep. 4, 2019

(65) Prior Publication Data

US 2020/0258793 A1 Aug. 13, 2020

(30) Foreign Application Priority Data

Feb. 8, 2019 (JP) .............................. JP2019-021942

(51) Int. Cl.
| | |
|---|---|
| *H01L 21/67* | (2006.01) |
| *H01L 21/66* | (2006.01) |
| *B41J 2/14* | (2006.01) |
| *H01L 21/027* | (2006.01) |
| *B05C 5/02* | (2006.01) |
| *B41J 2/005* | (2006.01) |

(52) U.S. Cl.
CPC ........ *H01L 21/6715* (2013.01); *B05C 5/0262* (2013.01); *B41J 2/005* (2013.01); *B41J 2/14201* (2013.01); *H01L 21/0273* (2013.01); *H01L 22/20* (2013.01)

(58) Field of Classification Search
CPC .................... B41J 2/14201; B41J 2/005; B41J 2002/14217; B41J 2002/14225; B41J 2002/14241; H01L 22/20; H01L 21/6715; H01L 21/0273; H01L 22/12; B05C 5/0225; B05C 5/0229; B05C 5/0262; B05C 5/0291; B05C 11/1026; B05C 11/1034
USPC ................................ 347/68, 72, 75; 118/429
See application file for complete search history.

(56) References Cited

U.S. PATENT DOCUMENTS

| | | | | |
|---|---|---|---|---|
| 4,326,205 A | * | 4/1982 | Fischbeck ............ | B41J 2/04533 347/40 |
| 5,363,131 A | * | 11/1994 | Momose ................ | B41J 2/0452 347/46 |

(Continued)

FOREIGN PATENT DOCUMENTS

| | | |
|---|---|---|
| JP | 2011-071500 A | 4/2011 |
| JP | 2011-171747 A | 9/2011 |

(Continued)

*Primary Examiner* — Laura Edwards
(74) *Attorney, Agent, or Firm* — Oblon, McClelland, Maier & Neustadt, L.L.P.

(57) ABSTRACT

According to one embodiment, a liquid delivery member is provided which is to be arranged at a predetermined distance from a processing object, and which is configured to deliver a liquid from a slit while the liquid delivery member and the processing object are caused to make relative displacement therebetween in a first direction. The liquid delivery member includes a delivery amount adjustment part provided on a face that forms the slit, extending in a second direction orthogonal to the first direction, and configured to adjust a delivery amount of the liquid.

14 Claims, 10 Drawing Sheets

(56) References Cited

U.S. PATENT DOCUMENTS

| | | |
|---|---|---|
| 8,609,006 B2 | 12/2013 | Mataki |
| 8,894,187 B2 | 11/2014 | Kodama et al. |
| 2005/0255249 A1* | 11/2005 | Schlatterbeck .......... B05D 1/36 |
| | | 427/372.2 |
| 2005/0270312 A1 | 12/2005 | Lad et al. |
| 2012/0069100 A1* | 3/2012 | Poruthoor .................. B41J 2/14 |
| | | 347/68 |
| 2013/0120485 A1 | 5/2013 | Kodama et al. |

FOREIGN PATENT DOCUMENTS

| | | |
|---|---|---|
| JP | 2012-011310 A | 1/2012 |
| JP | 2012-015324 A | 1/2012 |

* cited by examiner

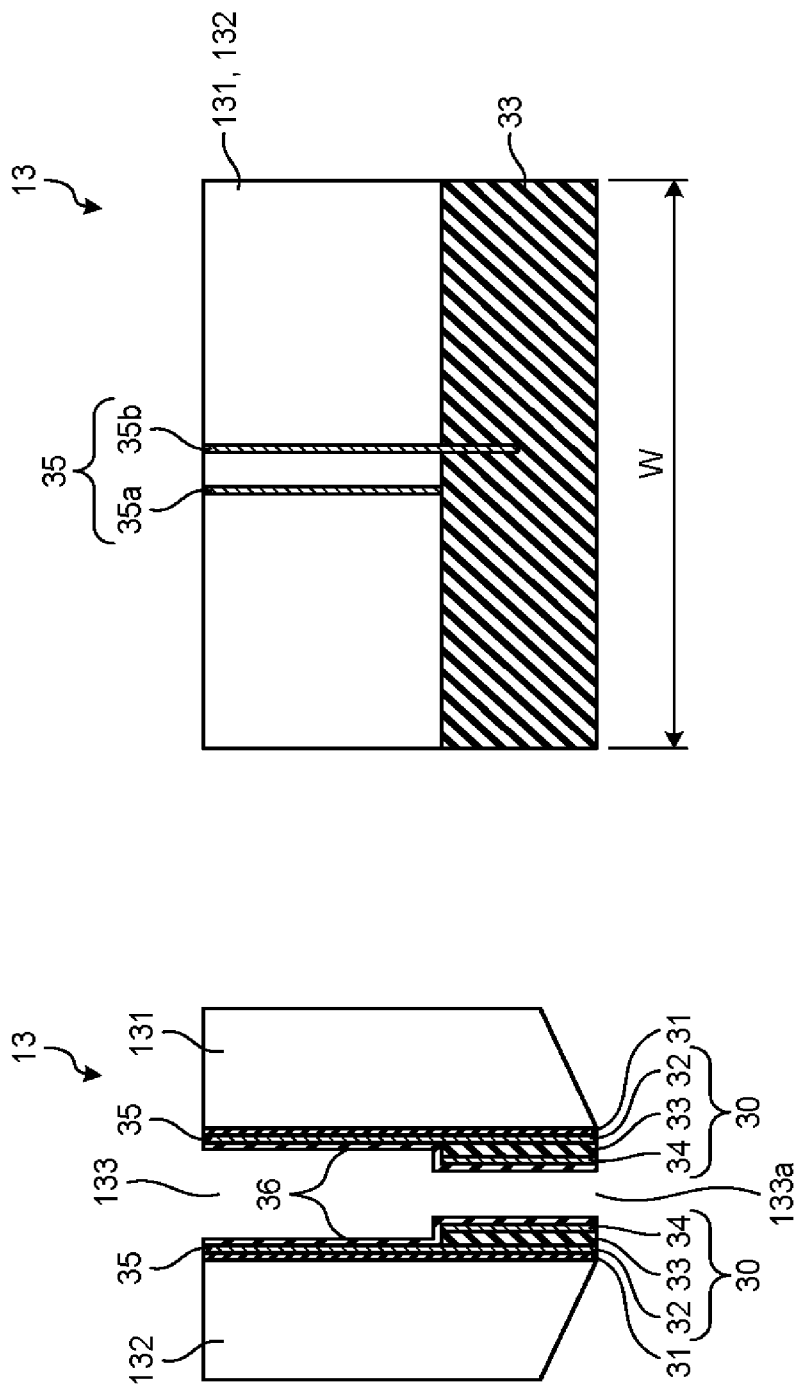

APPLICATION VOLTAGE IS 0V

APPLICATION VOLTAGE IS LARGE

APPLICATION VOLTAGE IS SMALL

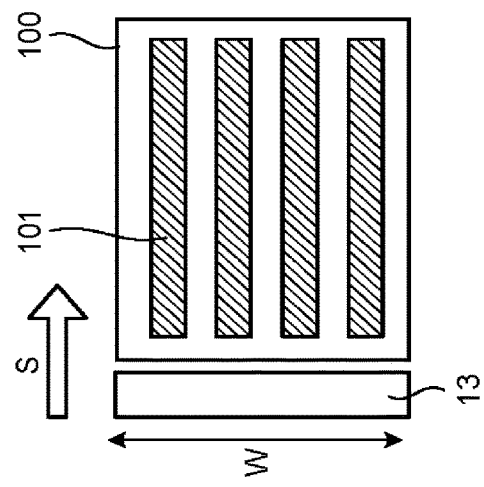
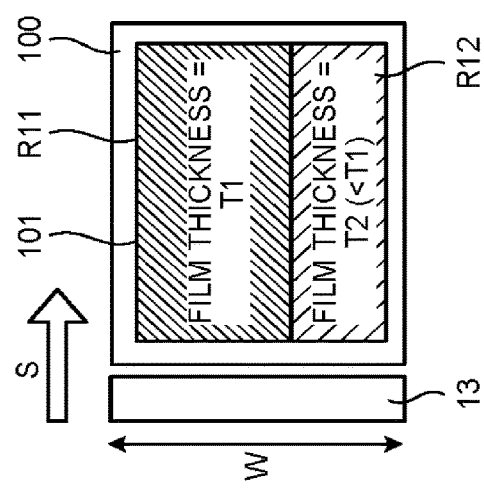
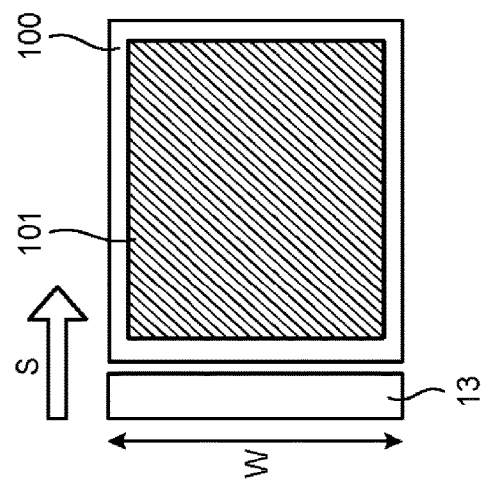
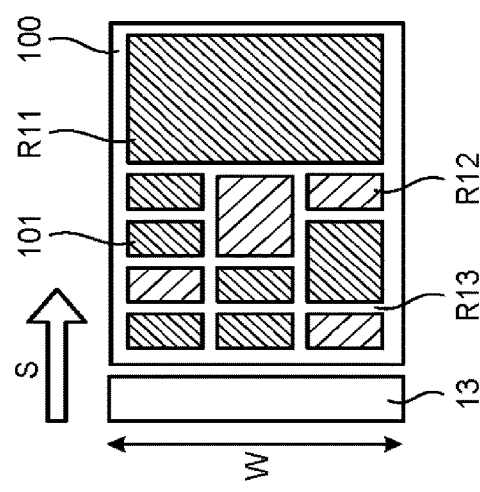
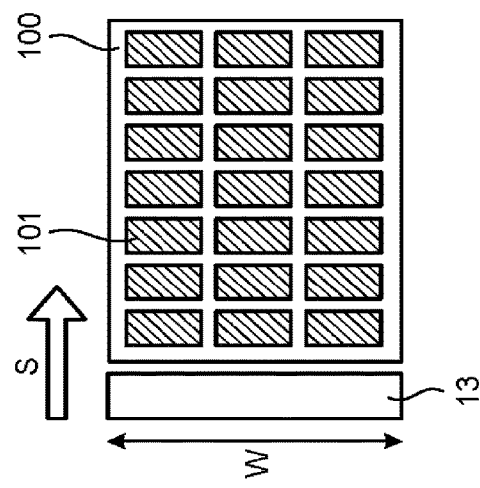

LIQUID DELIVERY MEMBER, LIQUID DELIVERY APPARATUS, AND SEMICONDUCTOR DEVICE MANUFACTURING METHOD

CROSS-REFERENCE TO RELATED APPLICATIONS

This application is based upon and claims the benefit of priority front Japanese Patent Application No. 2019-021942, filed on Feb. 8, 2019; the entire content of which are incorporated herein by reference.

FIELD

Embodiments described herein relate generally to a liquid delivery member, a liquid delivery apparatus, and a semiconductor device manufacturing method.

BACKGROUND

As one of the methods for forming fine patterns, there is an imprint method. In the imprint method, resist is dropped onto a processing object by an inkjet method, and a template is brought into contact with the resist such that the recessed portions of the template are filled with the resist. Thereafter, the resist is cured, and a resist pattern is thereby formed.

In the case of a resist pattern formed by using a resist dropped by an inkjet method, a Residual Layer Thickness (RLT) becomes almost uniform. The RLT is defined by the thickness of such a part of the resist pattern that is present between a processing object and the projected portions of the pattern formation face of a template (this part of the resist pattern will be referred to as "residual film", hereinafter).

BRIEF DESCRIPTION OF THE DRAWINGS

FIGS. 2A and 2B are sectional views illustrating a configuration example of a liquid delivery member according to the first embodiment;

FIGS. 9A to 9E are diagrams illustrating examples of application of a resist onto a processing object, according to the second embodiment;

DETAILED DESCRIPTION

In general, according to one embodiment, a delivery member is provided which is to be arranged at a predetermined distance from a processing object, and which is configured to deliver a liquid from a slit while the liquid delivery member and the processing object are caused to make relative displacement therebetween in a first direction. The liquid delivery member includes a delivery amount adjustment part provided on a face that forms the slit, extending in a second direction orthogonal to the first direction, and configured to adjust a delivery amount of the liquid.

Exemplary embodiments of a liquid delivery member, a liquid delivery apparatus, and a semiconductor device manufacturing method will be explained below in detail with reference to the accompanying drawings. The present invention is not limited to the following embodiments.

When the template is pressed onto droplets of the resist (each of which will be referred to as "resist droplet", hereinafter) dropped by the inkjet method, a foam entrapment defect unfilled with the resist is easily generated at the position where a resist droplet and a resist droplet are joined together.

First Embodiment

Figure 1:
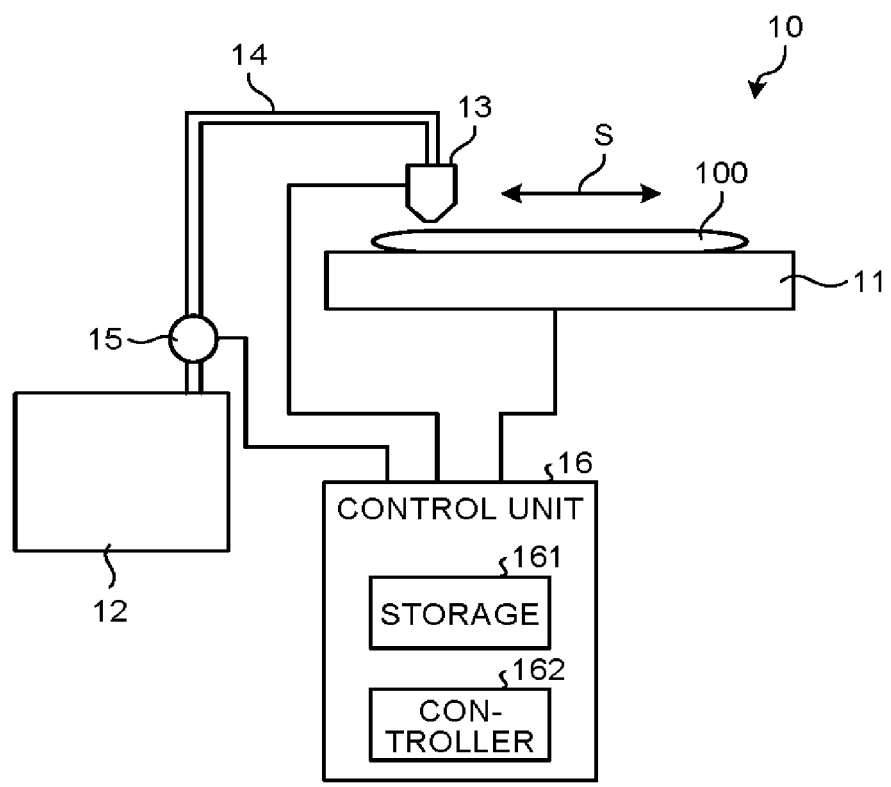
FIG. 1 is a diagram schematically illustrating a configuration example of a liquid delivery apparatus according to a first embodiment.

FIG. 1 is a diagram schematically illustrating a configuration example of a liquid delivery apparatus according to a first embodiment. FIGS. 2A and 2B are sectional views illustrating a configuration example of a liquid delivery member according to the first embodiment. Here, FIG. 2A is a sectional view of the liquid delivery member, taken in a direction perpendicular to its slit, and FIG. 2B is a sectional view of the liquid delivery member at the slit position, taken in a direction parallel with the slit.

The liquid delivery apparatus 10 includes a stage 11, a liquid storing part 12, a liquid delivery member 13, a piping line 14, a pump 15, and a control unit 16.

The stage 11 is configured to mount a processing object 100 thereon. For example, the processing object 100 is a semiconductor substrate, such as a silicon substrate, or a film, such as a metal film, a semiconductor film, or an insulating film, formed on a semiconductor substrate.

The liquid storing part 12 stores a liquid. For example, the liquid is a resist made of, e.g., a photo-curable resin. Hereinafter, an explanation will be given of a case where the liquid is a resist, as an example. The resist has viscosity of a degree to sustain its thickness on the processing object 100, after the resist is delivered onto the processing object 100.

The liquid delivery member 13 is formed of, for example, a slit coater die that includes an opening 133a shaped like a silt extending in the width direction and is configured to deliver the resist from the opening 133a onto the processing object 100. The liquid delivery member 13 and the liquid storing part 12 are connected to each other by the piping line 14. The liquid delivery member 13 is connected to the liquid storing part 12 through the piping line 14, and can deliver the resist from the liquid storing part 12 onto the processing object 100 in a continuous state.

As illustrated in FIGS. 2A and 2B, the liquid delivery member 13 has a structure in which a first block 131 and a second block 132 are joined together to form a slit 133. For example, the first block 131 and the second block 132 are made of stainless steal or the like. The distance between those faces of the first block 131 and the second block 132 which form the slit 133 can be set arbitrarily, but may be set to about several micrometers to several tens of micrometers, for example.

In the first embodiment, delivery amount adjustment parts 30 (an example of the delivers amount adjustment mechanisms) are provided on the respective ones of those faces of the first block 131 and the second block 132 which form the slit 133. The delivery amount adjustment parts 30 are arranged along the slit 133 in the width direction. The delivery amount adjustment parts 30 are used to adjust the resist delivery amount in accordance with an instruction from the control unit 16. In order to perform adjustment of the resist delivery amount in a short time after reception of an instruction from the control unit 16. the delivery amount adjustment parts 30 are preferably provided near the tip of the liquid delivery member 13, that is, near the opening 133a.

Each of the delivery amount adjustment parts 30 has a structure in which a first electrode 32, a piezoelectric element 33, and a second electrode 34 are stacked in order on the corresponding one of those faces of the first block 131 and the second block 132 which form the slit 133, near the tip. Here, an insulating layer 31 is provided entirely over each of those faces of the first block 131 and the second block 132 which form the slit 133. The first electrode 32 and the second electrode 34 are made of a conductive material, such as aluminum or copper, and serve as electrodes for applying a direct-current voltage to the piezoelectric element.

The piezoelectric element 33 is made of a material that has an inverse piezoelectric effect by which the material is to be deformed by application of an electric field. For example, the piezoelectric element 33 is made of a material, such as lead zirconate titanate ($Pb(Zr,Ti)O_3$), lead titanate ($PbTiO_3$), lead metaniobate ($PbNb_2O_6$), bismuth titanate ($Bi_4Ti_3O_{12}$), or lanthanum lead zirconate titanate ($(Pb,La)(Zr,Ti)O_3$). The piezoelectric element 33 is arranged to expand and contract in a direction perpendicular to those faces of the first block 131 and the second block 132 which form the slit 133, when a voltage is applied thereto. The thickness of each piezoelectric element 33 is set to a thickness with which the opening 133a is closed when the two piezoelectric elements 33 are caused to expand at the maximum.

The first electrode 32 and the second electrode 34 are connected to respective wiring lines 35. For example, the wiring lines 35 are made of a conductive material, such as aluminum or copper. As illustrated in FIG. 2B, the first electrode 32 is connected to a first wiring line 35a, and the second electrode 34 is connected to a second wiring line 35b. The first wiring line 35a and the second wiring line 35b are connected to a power supply (not illustrated). A protection film 36 is provided entirely over the insulating layer 31 on which the corresponding one of the delivery amount adjustment parts 30 is arranged together with the wiring lines 35. The protection film 36 may be formed of an organic film, or may be formed of an inorganic film, such as a silicon oxide film. Here, FIG. 2B omits illustration of the insulating layer 31, the second electrode 34, and the protection film 36.

The opening 133a of the liquid delivery member 13 has a width W that is equal to the width of the processing object 100, for example. As illustrated in FIG. 1, when the liquid delivery member 13 and The processing object 100 are paused to make relative displacement therebetween in a scanning direction S orthogonal to the width direction, the resist can be applied entirely over the processing object 100. The stage 11 and the liquid delivery member 13 are configured such that the relative positions therebetween can be changed. The liquid delivery member 13 applies the resist from the liquid storing part 12 onto the processing object 100 in accordance with an instruction from the control unit 16. In the liquid delivery member 13, the resist is delivered by a pressure applied to the fluid, and the two piezoelectric elements 33 are used to control the flow rate of the resist. Accordingly, the resist can be delivered in either of a continuous manner and a discontinuous manner, selectively.

The pump 15 is used to send out the resist from inside the liquid storing part 12 to the liquid delivery member 13.

The control unit 16 is configured to control the liquid delivery apparatus 10 as a whole. For example, the control unit 16 controls the relative displacement between the stage 11 and the liquid delivery member 13, the resist amount to be delivered from the liquid delivery member 13, the operation of the pump 15, and so forth.

The control unit 16 includes a storage 161 and a controller 162. The storage 161 stores recipes including scanning speed and liquid delivery member control information. Each of the recipes is provided for each type of processing object 100 or each type of semiconductor device manufacturing process. The liquid delivery member control information is information that prescribes resist amounts to be applied to the respective positions on the processing object 100. For example, the liquid delivery member control information is information that prescribes values of the application voltage to the piezoelectric elements 33 necessary for achieving degrees of the gap of the opening 133a (which will be referred to as "slit gap", hereinafter) to attain predetermined resist delivery amounts at the respective positions in the scanning direction S on the processing object 100. Here, the predetermined resist delivery amounts at the respective positions are determined such that the RLT comes to take a uniform value on the processing object 100 when the resist is cured in an imprint process.

The controller 162 acquires a recipe for the processing object 100 from the storage 161, and controls the operations of the stage 11, the liquid delivery member 13, and the pump 15 in accordance with the recipe. Here, in accordance with the position on the processing object 100 mounted on the stage 11, the controller 162 changes the voltage to be applied to the piezoelectric elements 33 of the liquid delivery member 13, to change the slit gap and deliver the resist.

Figure 3A:
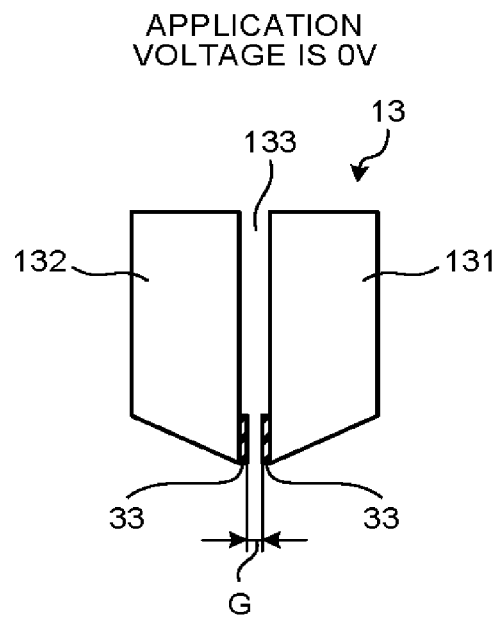
FIGS. 3A and 3B are diagrams illustrating an example of control over a resist delivery amount in the liquid delivery apparatus according to the first embodiment.
Figure 3B:
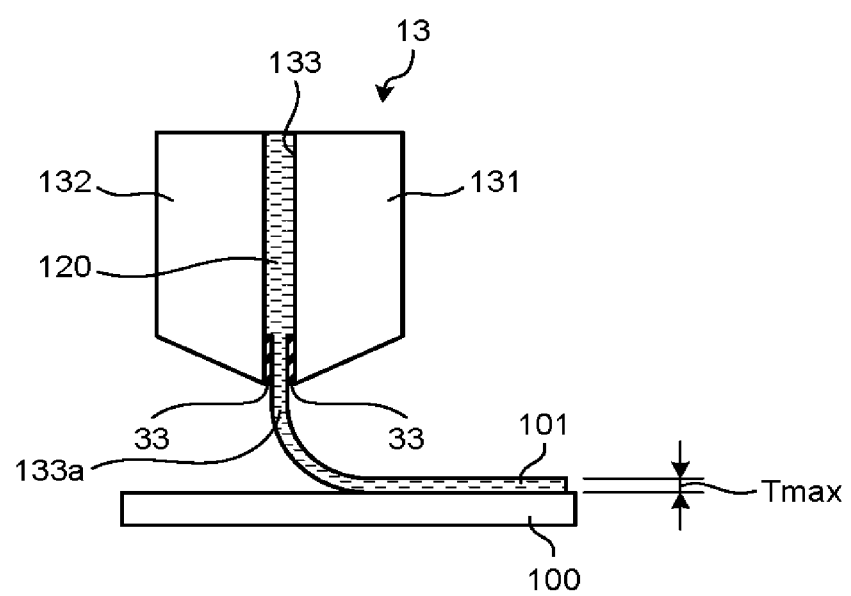
Figure 4A:
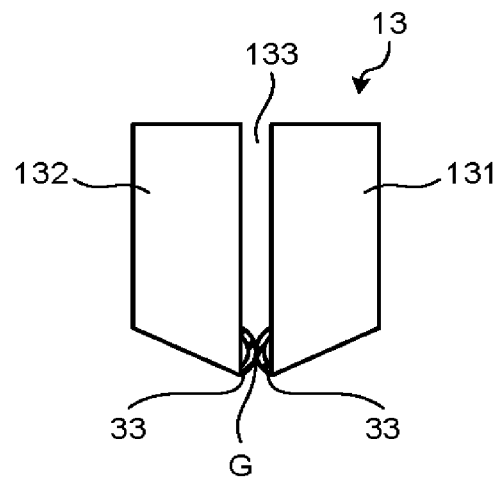
FIGS. 4A and 4B are diagrams illustrating an example of control over a resist delivery amount in the liquid delivery apparatus according to the first embodiment.
Figure 4B:
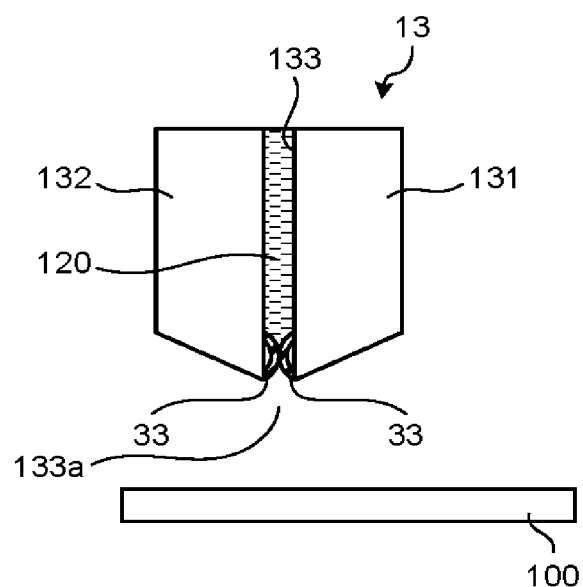
Figure 5A:
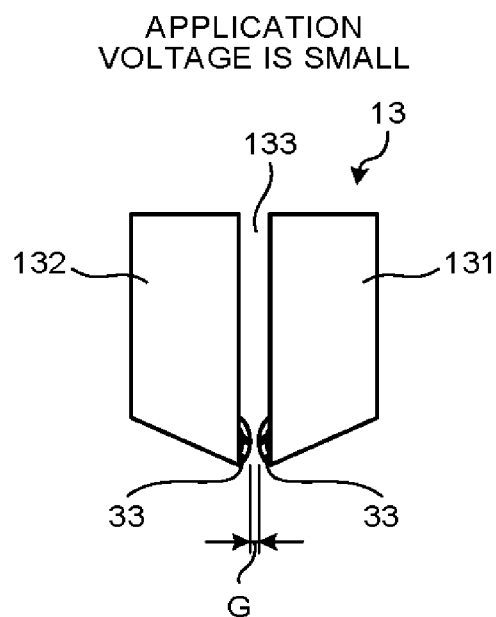
FIGS. 5A and 5B are diagrams illustrating an example of control over a resist delivery amount in the liquid delivery apparatus according to the first embodiment.
Figure 5B:
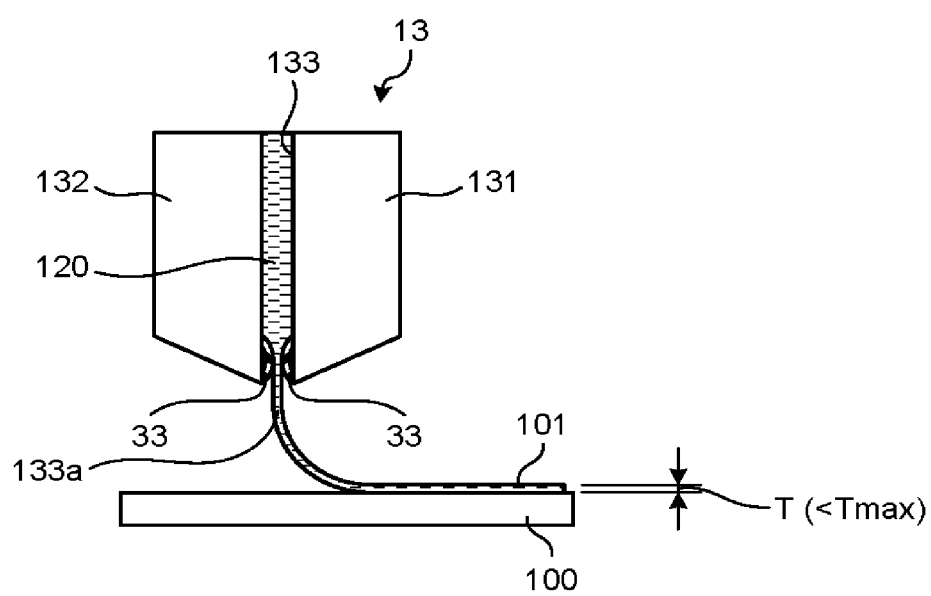

FIGS. 3A to 5B are diagrams illustrating examples of control over the resist delivery amount in the liquid delivery apparatus according to the first embodiment. FIGS. 3A, 4A, and 5A are diagrams schematically illustrating the relationship between the application voltage and the slit gap. FIGS. 3B, 4B, and 5B are diagrams schematically illustrating states of the resist being delivered. Here, in FIGS. 3A to 5B, only the piezoelectric elements 33 are illustrated as the delivery amount adjustment parts 30, for ease of explanation.

FIGS. 3A and 3B illustrate a case where the application voltage is 0V. As illustrated in FIG. 3A, when the application voltage is 0V, the piezoelectric elements 33 are in a state without expansion or contraction, and the slit gap G takes the maximum value. Thus, as illustrated in FIG. 3B, a resist film 101 to be formed by delivery of the resist onto the processing object 100 comes to have a thickness Tmax that is the maximum thickness.

FIGS. 4A and 4B illustrate a case where the application voltage is set to a voltage for the slit gap to be zero. As illustrated in FIG. 4A, as the application voltage to the piezoelectric elements 33 is larger, the respective piezoelectric elements 33 of the first block 131 and the second block 132 expand more, until coming into contact with each other. As a result, the slit gap G becomes zero. Thus, as illustrated in FIG. 4B, the resist cannot be delivered onto the processing object 100. In other words, a resist film to be formed on the processing object 100 comes to have a thickness of zero.

FIGS. 5A and 5B illustrate a case where the application voltage is set to a relatively small voltage for the slit gap not to be zero. As illustrated in FIG. 5A, when the application voltage to the piezoelectric elements 33 is smaller than that of the case of FIGS. 4A and 4B, the respective piezoelectric elements 33 of the first block 131 and the second block 132 expand to make the slit gap G set with a value larger than zero and smaller than the maximum value. Thus, as illustrated in FIG. 5B, a resist film 101 to be formed on the processing object 100 comes to have a thickness T that is smaller than the thickness Tmax of the resist film 101 mentioned in the case of FIG. 3B.

In this way, as the application voltage to the piezoelectric elements 33 is set to different values, a resist film 101 can be formed to have an arbitrary thickness T of up to Tmax continuously.

Figure 6:
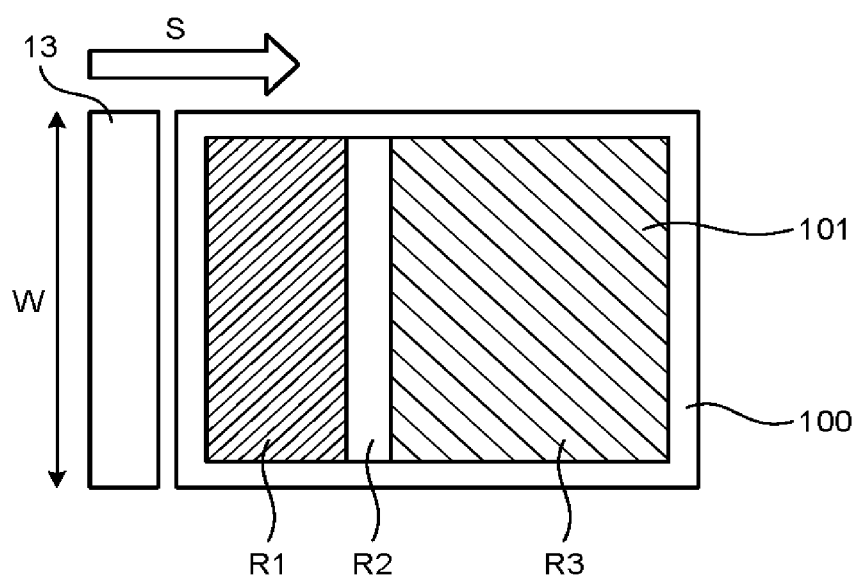
FIG. 6 is a diagram illustrating an example of application of a resist onto a processing object, according to the first embodiment.

FIG. 6 is a diagram illustrating an example of application of the resist onto the processing object, according to the first embodiment. Here, an explanation will be given of a case where a resist film 101 is formed while the processing object 100 and the liquid delivery member 13 are caused to make relative displacement therebetween in the scanning direction S. First, in a region R1, the controller 162 controls the application voltage to the piezoelectric elements 33 to form a resist film 101 with a thickness T1, for example. Then, when the position of the liquid delivery member 13 reaches a region R2, the controller 162 controls the application voltage to the piezoelectric elements 33 to set the slit gap G to be zero. Consequently, in the region R2, no resist film 101 is formed. Thereafter, when the position of the liquid delivery member 13 reaches a region R3, the controller 162 controls the application voltage to the piezoelectric elements 33 to form a resist film 101 with a thickness T2 smaller than the thickness T1, for example. Then, when the position of the liquid delivery member 13 has passed through the region R3, the controller 162 stops delivery of the resist onto the processing object 100.

In this way, resist films 101 different in thickness can be formed on the processing object 100. Further, at each of the positions (regions R1 and R3) where a resist film 101 is formed, the resist film 101 is formed in a continuous state.

Further, the controller 162 acquires a measurement result about the RLT of a resist pattern obtained by curing a resist film 101 on the processing object 100. Then, for a portion where the RLT deviates from a reference value range, the controller 162 alters the liquid delivery member control information of the recipe to cause the RLT to fail within the reference value range. The recipe thus altered is used for application of the resist onto the next processing object 100. As described above, feedback control is performed to cause the RLT to fall within the reference value range, for a resist pattern to be obtained by curing a resist film 101 on the processing object 100.

Figure 7:
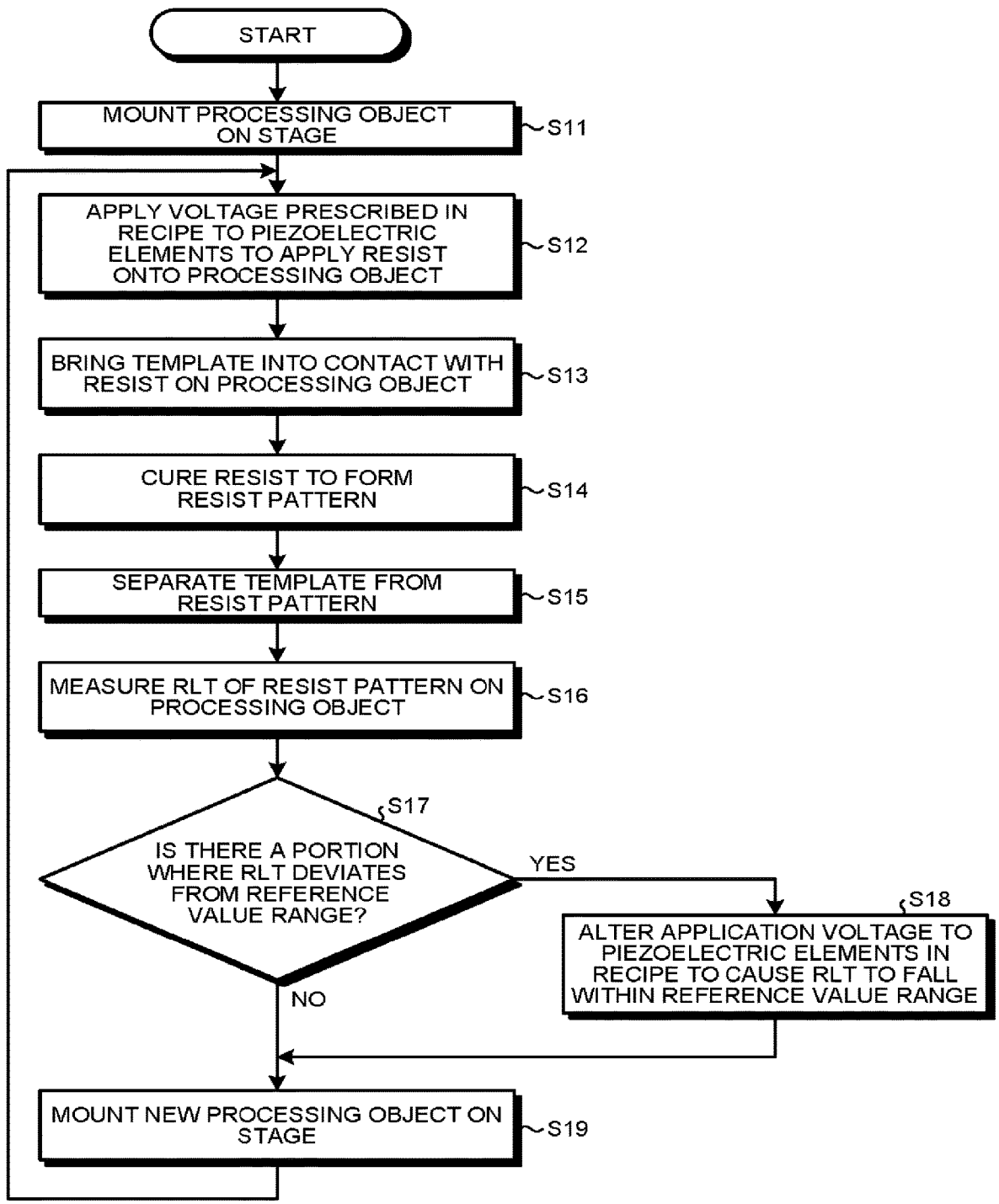
FIG. 7 is a flowchart illustrating an example of a semiconductor device manufacturing method according to the first embodiment.

Next, an explanation will be given of a semiconductor device manufacturing method including a liquid delivery method in the liquid delivery apparatus described above. FIG. 7 is a flowchart illustrating an example of a semiconductor device manufacturing method according to the first embodiment. First, a processing object 100 is mounted on the stage 11 of the liquid delivery apparatus 10 (step S11).

Then, the controller 162 of the control unit 16 acquires a recipe corresponding to the processing object 100 from the storage 161, and controls the operations of the stage 11, the liquid delivery member 13, and the pump 15 in accordance with the recipe. Here, the controller 162 causes the stage 11 and the liquid delivery member 13 to make relative displacement therebetween in the scanning direction 3, and concurrently applies a voltage prescribed in the liquid delivery member control information of the recipe to the piezoelectric elements 33, to apply the resist onto the processing object (step S12).

Thereafter, the pattern arrangement face of a template with a concave-convex pattern provided thereon is brought into contact with the resist on the processing object 100 (step S13). After the recessed patterns of the pattern arrangement face are filled with the resist, the resist is cured, and a resist pattern is thereby formed (step S14). For example, when the resist is made of a photo-curable resin, the resist is cured by irradiation with light, such as ultraviolet light, and the resist pattern is thereby formed. Then, the template is separated from the resist pattern (step S15). Here, when the area of a resist applied region on the processing object 100 is larger than the pattern formation face of the template, the processes of step S13 to step S15 are repeatedly performed for resist applied regions not yet subjected to the curing.

Thereafter, the RLT of the resist pattern on the processing object 100 is measured (step S16). For example, the RLT measurement is performed by using a film thickness measuring device, such as a laser interferometer, (not illustrated). The RLT measurement result is output from the film thickness measuring device to the control unit 16.

Then, the controller 162 compares values of the RLT at respective positions on the processing object 100 with a reference value range, and determines whether there is a portion where the RLT deviates from the reference value range (step S17). The reference value range indicates a range of the RLT preferable on the processing object 100.

When there is a portion where the RLT deviates from the reference value range (Yes at step S17), the controller 162 alters the corresponding voltage prescribed in the liquid delivery member control information of the recipe, to attain a resist delivery amount that causes the RLT to fall within the reference value range (step S18). At this time, the controller 162 alters the application voltage to the piezoelectric elements 33 for the portion where the RLT deviates from the reference value range.

Thereafter, or when there is no portion where the RLT deviates from the reference value range (No at step S17), a new processing object 100 is mounted on the stage 11 (step S19). Then, the processes from step S12 are performed for this new processing object 100. Here, when the recipe has been altered in step S18, the process in step S12 is performed in accordance with the altered recipe.

In the example described above, as illustrated in FIG. 2A, the liquid delivery member 13 is structured such that the delivery amount adjustment parts 30 are provided on the respective ones of those faces of the first block 131 and the second block 132 which form the slit 133. However, the embodiment is not limited to this example. For example, where the slit 133 can be closed by deformation of only one piezoelectric element 33, the delivery amount adjustment part 30 may be provided on either one of those faces of the first block 131 and the second block 132 which form the slit 133.

In the first embodiment, the delivery amount adjustment parts 30 for adjusting the slit gap G by the application voltage are provided inside the slit 133 of the liquid delivery member 13. The controller 162 changes the slit gap G depending on the position of the liquid delivery member 13 above the processing object 100, in accordance with the recipe. Consequently, the resist delivery amount can be changed depending on the position of the liquid delivery member 13 above the processing object 100. Further, a resist film to be formed on the processing object 100 can be a continuous film. As a result, in an imprint process, it is possible to suppress generation of foam entrapment, and to set the RLT of a cured resist to be almost uniform entirely over the processing object 100.

Second Embodiment

In the first embodiment, the delivery amount adjustment parts are provided to set the slit gap to be constant entirely over the liquid delivery member in the width direction. In the second embodiment, an explanation will be given of a case where the slit gap can be set to have different distances in the width direction of a liquid delivery member.

Figure 8:
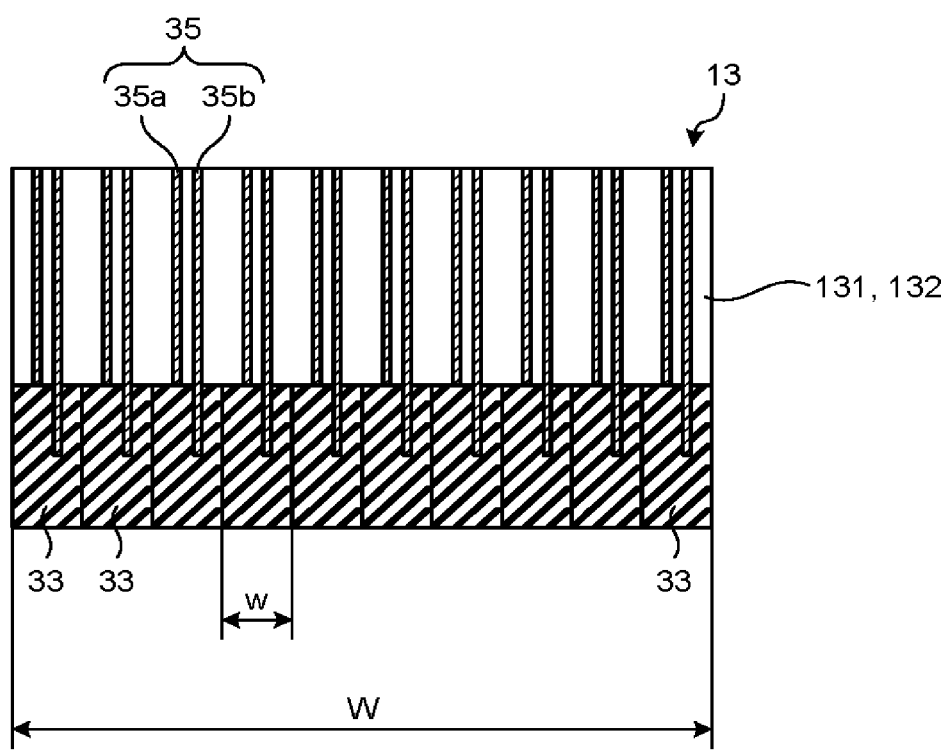
FIG. 8 is a sectional view illustrating a configuration example of a liquid delivery member according to a second embodiment at the position of a slit, taken in a direction parallel with the slit.

FIG. 8 is a sectional view illustrating a configuration example of a liquid delivery member according to a second embodiment at the position of a slit, taken in a direction parallel with the slit. Here, FIG. 8 omits illustration of the insulating layer 31, second electrodes 34, and the protection film 36. As illustrated in FIG. 8, a plurality of piezoelectric elements 33 each having a width "w" smaller than the width 81 of the liquid delivery member 13 are arranged in the width direction on each of the faces that form the slit 133. Each of the piezoelectric elements 33 is connected to a first electrode and a second electrode 34. Further, each of the first electrodes 32 is connected to a first wiring line 35a, and each of the second electrodes 34 is connected to a second wiring line 35b. As the plurality of piezoelectric elements 33 are arranged in the width direction in this way, the resist delivery amount can be adjusted in units of the width "w" of each piezoelectric element 33.

FIGS. 9A to 9E are diagrams illustrating examples of application of a resist onto a processing object, according to the second embodiment. When the distances of the slit gap corresponding to the respective piezoelectric elements 33 are controlled at the respective positions in the width direction of the liquid delivery member 13 and depending on the position of the liquid delivery member 13 in the scanning direction, various resist films 101 can be formed. For example, as illustrated in FIG. 9A, a resist film 101 can be applied to have a uniform thickness entirely over the processing object 100. Alternatively, as illustrated in FIG. 9E, resist films 101 can be applied to have different thicknesses in the width direction. In the case of FIG. 9B, a region R11 is given a resist film 101 formed with a thickness T1, and a region R12 is given a resist film 101 formed with a thickness T2, such that the thickness T1 is larger than the thickness T2.

FIG. 9C illustrates a case where strip format resist films 101 are applied on the processing object 100 such that linear patterns extending in the scanning direction S are arrayed in the width direction. FIG. 9D illustrates a case where checker format resist films 101 are applied on the processing object 100 such that rectangular patterns each having a predetermined size are periodically arrayed in the width direction and the scanning direction S. Further, FIG. 9E illustrates a case where resist films 101 are applied on the processing object 100 such that rectangular patterns different in size and thickness are arrayed in the width direction and the scanning direction S. In FIG. 9F, a region R11 is given a resist film 101 formed with a thickness T1, a region R12 is given a resist film 101 formed with a thickness 12 (<T1), and a region R13 is given no resist film 101 formed thereon. Other than these examples, resist films 101 can be applied on the processing object 100 to provide various patterns in units of the width "w" of each piezoelectric element 33.

Here, in the example describe with reference to FIG. 8, the liquid delivery member 13 is structured such that a plurality of piezoelectric elements 33 are arranged in the width direction on each of the faces that form the slit 133. However, the embodiment is not limited to this example. For example, the liquid delivery member 13 may be structured such that one piezoelectric element is arranged entirely in the width direction on each of the faces that form the slit 133, and a plurality of sets of a first electrode 32 and a second electrode 34 each having a width "w" smaller than the width P of the liquid delivery member 13 are arranged in the width direction on each of the faces that form the slit 133. In other words, it suffices that the delivery amount can be adjusted in units divided in the width direction of the faces that form the slit 133.

In the second embodiment, the liquid delivery member 13 is structured such that a delivery amount adjustment part 30 divided in the width direction is arranged on each of the faces that form the slit 133. Consequently, the resist delivery amount can be controlled, depending on not only the position in the scanning direction S but also the position in the width direction. For example, when the processing object 100 has a circular shape, the resist delivery amount can be controlled at the peripheral portion of the processing object 100.

Third Embodiment

In each of the first and second embodiments, the slit gap is adjusted by expansion and contraction of the delivery amount adjustment parts. For example, when the slit gap is set to become zero, the delivery amount adjustment parts are operated to come into contact with each other. In this case, if the contact between the delivery amount adjustment parts is incomplete, a slight amount of resist could be leaked. In the third embodiment, an explanation will be given of a case where the resist leakage can be suppressed when the slit gap is set to zero.

Figure 10:
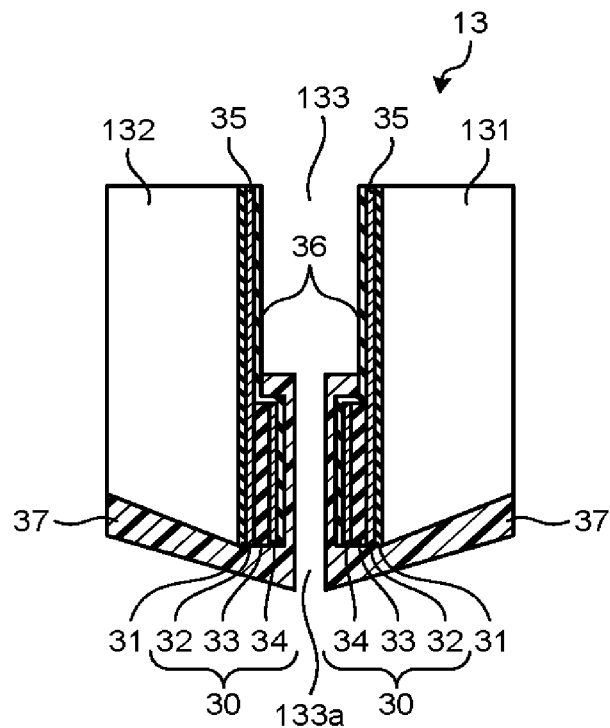
FIG. 10 is a sectional view illustrating a liquid delivery member according to a third embodiment, taken in a direction perpendicular to a slit.

FIG. 10 is a sectional view illustrating a liquid delivery member according to the third embodiment, taken in a direction perpendicular to the slit. Here, the constituent elements corresponding to those of the first and second embodiments are denoted by the same reference symbols, and particulars different from the first and second embodiments will be described.

As illustrated in FIG. 10, the liquid delivery member 13 according to the third embodiment further includes elastic films 37 covering the respective ones of the delivery amount adjustment parts 30. The elastic films 37 provide a function to suppress the resist leakage from between the delivery amount adjustment parts 30 in contact with each other when the slit gap is set to zero. Here, the elastic films 37 are preferably resistant to chemicals. For example, the elastic films 37 are made of a rubber. Further, the piezoelectric elements 33 preferably have loading performance to collapse the elastic films 37.

Here, as the elastic films 37 are provided, the protection films 36 arranged on the respective second electrodes 34 may be omitted.

In the third embodiment, the elastic films 37 are further provided which cover the respective ones of the delivery amount adjustment parts 30. Consequently, it is possible to suppress the resist leakage from between the delivery amount adjustment parts 30 in contact with each other when the slit gap is set to zero.

Here, in the example describe above, the width W of the liquid delivery member 13 is equal to the width of the processing object 100. However, the width of the liquid delivery member 13 may be set equal to the width of each unit to be processed in the processing object 100. For example, as an imprint process is performed in units of a shot region, the width of the liquid delivery member 13 may be set equal to a dimension of a rectangular shot region in either one of the width direction and the length direction.

Figure 11:
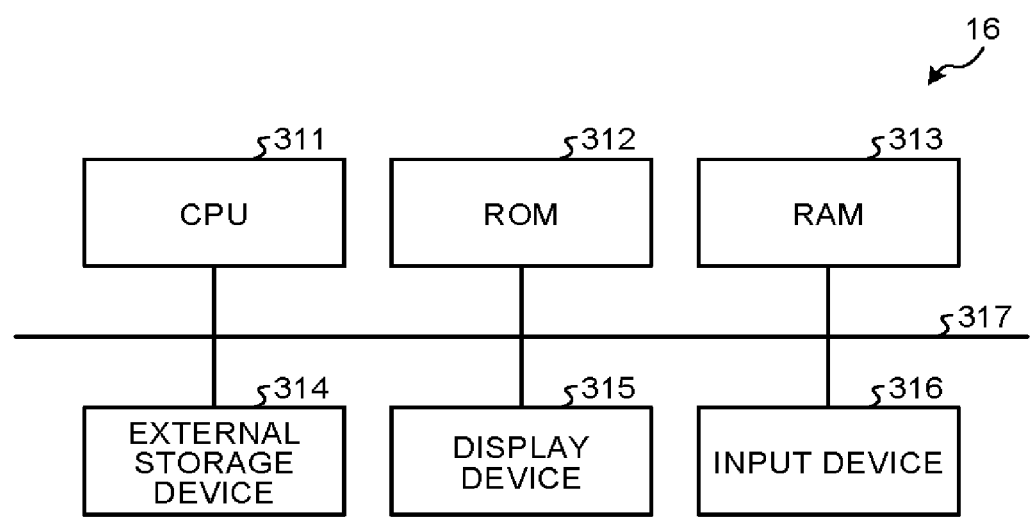
FIG. 11 is a diagram illustrating a hardware configuration example of a control unit.

FIG. 11 is diagram illustrating a hardware configuration example of the control section. The control section 16 has a hardware configuration utilizing an ordinary computer, in which a Central Processing Unit (CPU) 311, a Read Only Memory (ROM) 312, a Random Access Memory (RAM) 313 serving as the main storage device, an external storage device 314, such as a Hard Disk Drive (HDD), Solid State Drive (SSD), or Compact Disc (CD) drive device, a display device 315, such as a display unit, and an input device 316, such as a keyboard and/or a mouse, are included, and are connected to each other via a bus line 317.

A program to be executed by the control section 16 according to this embodiment has been prepared to perform the method illustrated in FIG. 7. This program is provided in a state recorded in a computer readable recording medium, such as a CD-ROM, flexible disk (FD), CD-R, or Digital Versatile Disk (DVD), by a file in an installable format or executable format.

Alternatively, a program to be executed by the control section 16 according to this embodiment may be provided such that the program is stored in a computer connected to a network, such as the internet, and is downloaded via the network. Alternatively, a program to be executed by the control section 16 according to this embodiment may be provided such that the program is provided or distributed via a network, such as the internet.

Alternatively, a program according to this embodiment may be provided in a state incorporated in an ROM or the like in advance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid delivery member delivering a liquid onto a processing object while being caused to make relative displacement between the liquid delivery member and the processing object in a first direction, the liquid delivery member comprising:
a first block and a second block that are disposed to interpose a slit, into which the liquid is supplied, the first and second blocks each having a width extending in a second direction orthogonal to the first direction: and
delivery amount adjustment mechanisms each configured to adjust a delivery amount of the liquid, each of the delivery amount adjustment mechanisms:
including a piezoelectric element that deforms in accordance with an applied voltage and changes a gap of the slit, the piezoelectric element having a width smaller than the width of each of the first and second blocks; and
being provided at a tip of the first block or the second block, from which the liquid is delivered onto the processing object,
wherein the delivery amount adjustment mechanisms are arranged in the second direction on a face of the first block and/or a face of the second block in the slit.

2. The liquid delivery member according to claim 1, wherein each of the delivery amount adjustment: mechanisms is configured to change a gap of the slit in units of a predetermined length in the second direction.

3. The liquid delivery member according to claim 1, wherein each of the delivery amount adjustment mechanisms further includes a first electrode and a second electrode that are stacked while interposing the piezoelectric element.

4. The liquid delivery member according to claim 1, wherein each of the delivery amount adjustment mechanisms is configured to change a gap of the slit in the first direction.

5. The liquid delivery member according to claim 1, wherein the delivery amount adjustment mechanisms are provided to face each other on the faces of the first block and the second block in the slit.

6. The liquid delivery member according to claim 1, wherein each of the delivery amount adjustment mechanisms is configured to set a gap of the slit constant among positions in the second direction.

7. A liquid delivery apparatus, comprising:
a stage configured to mount a processing object thereon;
a liquid storing part that stores a liquid;
a liquid delivery member configured to receive the liquid from the liquid storing part through a piping line and to deliver the liquid onto the processing object, the liquid delivery member being caused to make relative displacement between the liquid delivery member and the stage in a first direction; and
a controller configured to control operation of the stage and the liquid delivery member, wherein
the liquid delivery member includes:
a first block and a second block that are disposed to interpose a slit, into which the liquid received through the piping line is supplied, the first and second blocks each having a width extending in a second direction orthogonal to the first direction: and
delivery amount adjustment mechanisms each configured to adjust a delivery amount of the liquid in accordance with an instruction from the controller, each of the delivery amount adjustment mechanisms:
including a piezoelectric element that deforms in accordance with an applied voltage and changes a gap of the slit, the piezoelectric element having a. width smaller than the width of each of the first and second blocks; and
being provided at a tip of the first block or the second block, from which the liquid is delivered onto the processing object, and
the delivery amount adjustment mechanisms are arranged in the second direction on a face of the first block and/or a face of the second block in the slit.

8. The liquid delivery apparatus according to claim 7, wherein each of the delivery amount adjustment mechanisms is configured to change a gap of the slit in units of a predetermined length in the second direction.

9. The liquid delivery apparatus according to claim 7, wherein each of the delivery amount adjustment mechanisms further includes a first electrode and a second electrode that are stacked while interposing the piezoelectric element.

10. The liquid delivery apparatus according to claim 7, wherein each of the delivery amount adjustment mechanisms is configured to change a gap of the slit in the first direction.

11. The liquid delivery apparatus according to claim 7. wherein the delivery amount adjustment mechanisms adjustment mechanisms are provided to face each other on the faces of the first block and the second block in the slit.

12. The liquid delivery apparatus according to claim 7, wherein each of the delivery amount adjustment mechanism is configured to set a gap of the slit constant among positions in the second direction.

13. The liquid delivery member according to claim 1, further comprising elastic films having elasticity, the elastic films being provided to cover the delivery amount adjustment mechanisms.

14. The liquid delivery apparatus according to claim 7, wherein the liquid delivery member further includes elastic films having elasticity, the elastic films being provided to cover the delivery amount adjustment mechanisms.

\* \* \* \* \*